(12) United States Patent
Peterson et al.

(10) Patent No.: US 6,638,778 B1
(45) Date of Patent: Oct. 28, 2003

(54) METHOD FOR DETERMINING, TRACKING AND/OR CONTROLLING PROCESSING BASED UPON SILICON CHARACTERISTICS

(75) Inventors: Anastasia Oshelski Peterson, Austin, TX (US); Sam H. Allen, Jr., New Braunfels, TX (US); Jason A. Grover, Austin, TX (US); Michael R. Conboy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/082,809

(22) Filed: Feb. 25, 2002

(51) Int. Cl.[7] ............................................... H01L 21/66
(52) U.S. Cl. ...................................................... 438/14
(58) Field of Search ............................... 438/14, 17, 18

(56) References Cited

U.S. PATENT DOCUMENTS 5,721,741 A * 2/1998 Deas ........................... 371/22.1
6,124,725 A * 9/2000 Sato ............................ 324/765
6,349,240 B2 * 2/2002 Ogawa et al. ................ 700/121

OTHER PUBLICATIONS

Wolf (Silicon Processing for the VLSI Era, vol. 1, pp 26–30).*

* cited by examiner

Primary Examiner—David Nelms
Assistant Examiner—Quoc Hoang
(74) Attorney, Agent, or Firm—Williams, Morgan & Amerson, P.C.

(57) ABSTRACT

The present invention is generally directed to various methods for determining, tracking and/or controlling processing based upon wafer characteristics. In one embodiment, the method is directed to selecting a plurality of wafers from the group of wafers based upon the semiconductor device to be manufactured on the wafer and at least one characteristic of the wafers. In another embodiment, the method comprises identifying a source of wafers wherein the device metrology data lies outside of the preselected range based upon the wafer identification mark and the device metrology data. As yet another example, the method comprises determining at least one parameter of a process operation to be performed on a wafer in a processing tool based upon the determined wafer characteristics.

42 Claims, 3 Drawing Sheets

METHOD FOR DETERMINING, TRACKING AND/OR CONTROLLING PROCESSING BASED UPON SILICON CHARACTERISTICS

BACKGROUND OF THE INVENTION

1. Field of the Invention

This invention relates generally to semiconductor fabrication technology, and, more particularly, to various methods for determining, tracking and/or controlling processing based upon various characteristics of silicon wafers.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate 11.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, metals, etc., and the selective removal of portions of those layers by performing known photolithographic and etching techniques. These processes, along with various ion implant and heating processes, are continued until such time as the integrated circuit device is complete.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.18 $\mu$m (1800 Å), and further reductions are planned in the future. The width 12 of the gate electrode 14 corresponds approximately to the channel length 13 of the transistor 10 when it is operational. Thus, even slight variations in the actual dimension of a feature as fabricated may adversely affect device performance.

FIG. 2 depicts an illustrative embodiment of a wafer 11 having a plurality of die 24 formed thereabove. The die 24 define the area of the wafer 11 where production integrated circuit devices, e.g., microprocessors, ASICs, memory devices, will be formed. The size, shape and number of die 24 per wafer 11 depend upon the type of device under construction. For example, several hundred die 24 may be formed above an 8-inch diameter wafer 11. The die 24 are separated by scribe lines 26. Eventually, after all processing operations are complete, the wafer 11 will be cut along the scribe lines 26, and each of the production die 24 will be packaged and sold.

In modern semiconductor manufacturing, great care is taken in producing the wafers 11 upon which various integrated circuit devices will be formed. In fact, a purchaser of such wafers from a wafer vendor will often provide a very detailed wafer product specification to the vendor that sets forth various required characteristics of the wafers to be purchased. Such wafers may be comprised of a variety of materials, e.g., silicon, gallium arsenide, etc., and they may be formed by a variety of techniques. For example, silicon wafers are typically formed by initially forming a cylindrically shaped ingot of the material, and, thereafter, slicing or sawing the ingot into individual wafers 11. In some cases, a layer of epitaxial silicon (not shown) may be formed on one surface of the wafer by the wafer manufacturer. The silicon material is often doped with an N-type or P-type dopant material.

There are many known processes for forming such ingots of material, e.g., the Czochralski method, the float zone method, the liquid crystal-encapsulated (LEC) Czochralski method (for gallium arsenide), etc. In general, the manufacture of integrated circuit devices require extremely tight product specifications for the wafers, and a high degree of crystal perfection. However, even with the most sophisticated techniques, defects or imperfections still occur, to some degree, in the wafers used in manufacturing integrated circuit devices. Such imperfections include, but are not limited to, crystalline defects, e.g., point defects, dislocations and growth defects, doping level defects, surface flatness or irregularities, resistivity variations, variations in the thickness of the epitaxial silicon layer, etc. Such defects may cause undesirable current leakages, or other electrical performance deficiencies, in completed devices. Obviously, such problems are undesirable in modern semiconductor device manufacturing.

The present invention is directed to a method and system that may solve, or at least reduce, some or all of the aforementioned problems.

SUMMARY OF THE INVENTION

The present invention is generally directed to various methods for determining, tracking and/or controlling processing based upon wafer characteristics. In one illustrative embodiment, the method comprises providing a group of wafers, each wafer having a plurality of wafer characteristics, determining a semiconductor device type to be manufactured, selecting a plurality of wafers from the group of wafers based upon the semiconductor device type to be manufactured and at least one of the wafer characteristics and manufacturing a plurality of the determined semiconductor devices on the selected plurality of wafers. In another embodiment, the method comprises providing the wafer characteristics and the identified semiconductor device type to a controller that selects a plurality of wafers from the group of wafers based upon one or more of the wafer characteristics and the type of semiconductor device to be manufactured.

In another illustrative embodiment, the method comprises providing a group of wafers, each wafer having an identification mark, performing a plurality of process operations on each of the wafers to form integrated circuit devices thereabove and performing at least one metrology test at some point after the process operations have been performed, to produce device metrology data. The method further comprises identifying wafers wherein the device metrology data lies outside of a preselected acceptable range and identifying a source of the wafers wherein the device metrology data lies outside of the preselected range based upon the wafer identification mark. In some cases, the wafer identification mark and device metrology data may be provided to a controller and the controller may identify the source of wafers when the device metrology data lies outside of the preselected acceptable range.

In yet another illustrative embodiment, the method comprises providing a plurality of wafers, the wafers having an identification mark and a plurality of wafer characteristics, storing the wafer identification marks and wafer characteristics associated with the marks in a database and providing at least one of the wafers to a processing tool. The method further comprises accessing the database to determine at least one of the wafer characteristics of at least one wafer provided to the processing tool and determining at least one parameter of a process operation to be performed on the wafer in the processing tool based upon the determined wafer characteristic of the wafer.

BRIEF DESCRIPTION OF THE DRAWINGS

The invention may be understood by reference to the following description taken in conjunction with the accompanying drawings, in which like reference numerals identify like elements, and in which.

Figure 1:
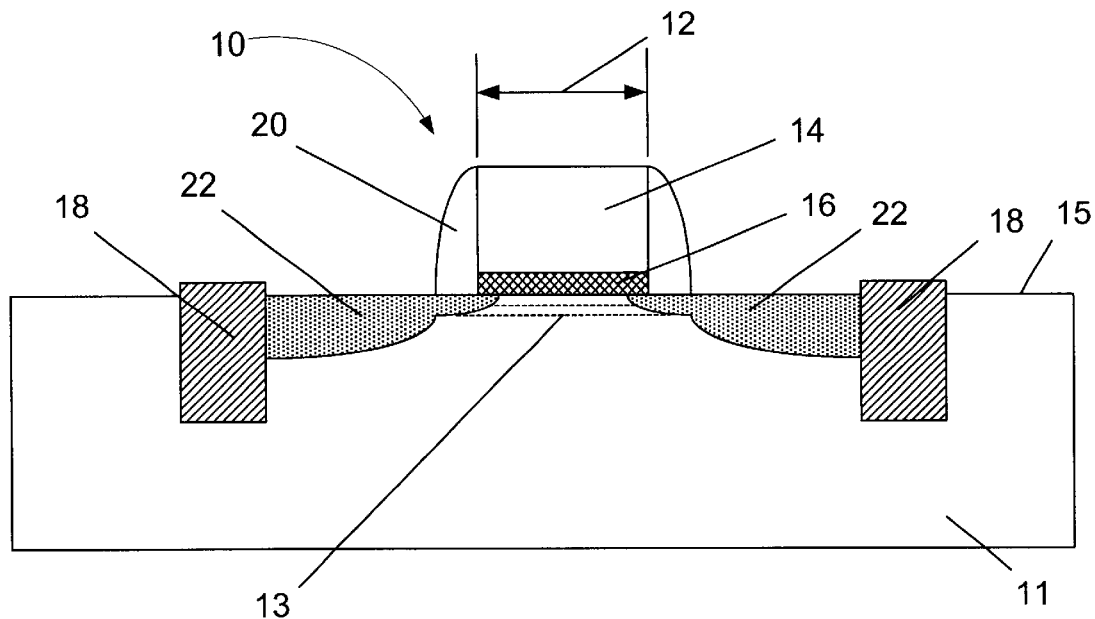
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, for purposes of clarity, the illustrative systems depicted herein do not include all of the supporting utilities for such systems. Nevertheless, the attached drawings are included to describe and explain illustrative examples of the present invention. The words and phrases used herein should be understood and interpreted to have a meaning consistent with the understanding of those skilled in the relevant art. No special definition of a term or phrase, i.e., a definition that is different from the ordinary and customary meaning as understood by one skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods for determining, tracking and/or controlling processing based upon wafer characteristics. More particularly, in one embodiment, the present invention is directed to correlating various characteristics or properties of wafers with various metrology data obtained during the course of manufacturing integrated circuit devices, and performing various control functions based upon such correlations. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

As an initial matter, it should be understood that the present invention may be used with wafers comprised of any of a variety of semiconducting materials, e.g., silicon, gallium arsenide, etc. Moreover, such wafers, if appropriate, may be doped with a variety of dopant materials, e.g., arsenic, phosphorous, boron, etc. Lastly, as used herein, the term wafer should be understood to include the bare wafer itself, i.e., bare silicon, or a wafer having an epitaxial silicon layer (epi layer) formed above the bare silicon. In some instances, wafer suppliers form such an epi layer on the wafer prior to delivery to the semiconductor device manufacturer. In other instances, the semiconductor device manufacturer is provided with a bare silicon wafer and forms the epi layer on the wafer during one of the initial process steps.

Figure 3:
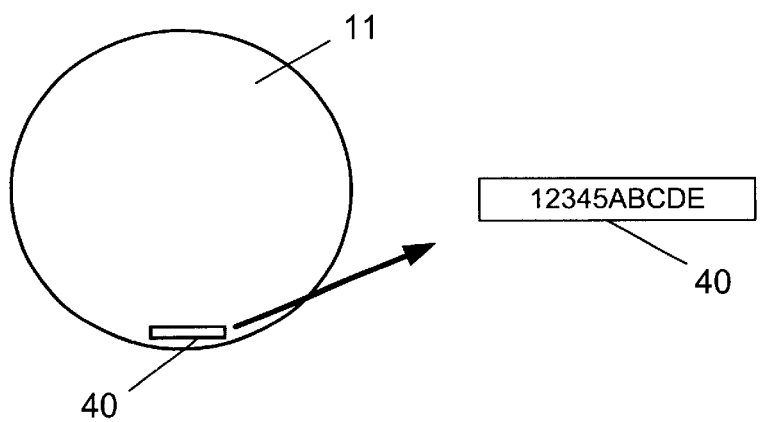
FIG. 3 depicts an illustrative wafer having an identification mark thereon.
Figure 2:
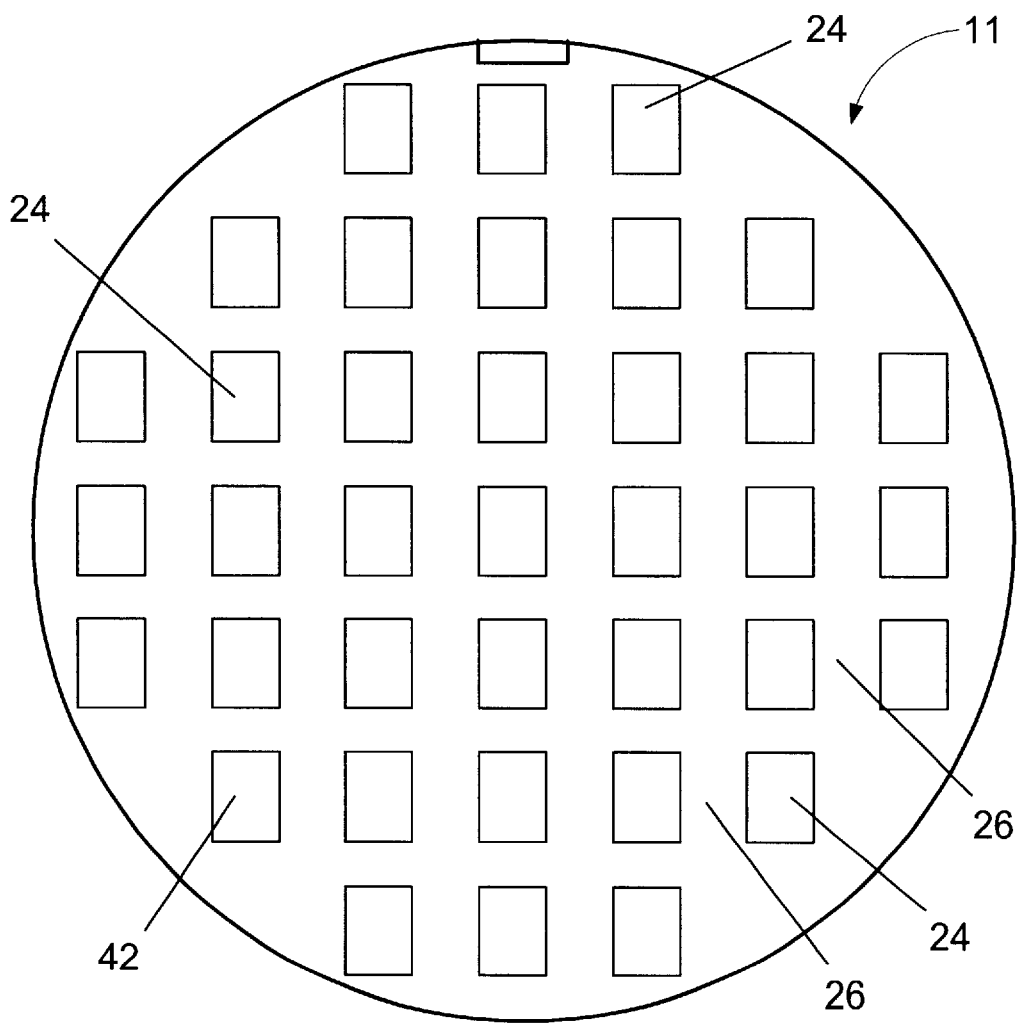
FIG. 2 is a plan view of an illustrative prior art wafer having a plurality of die formed thereabove.

Semiconducting wafers are typically supplied to a semiconductor device manufacturer through one or more vendors. Typically, each semiconductor device manufacturer will provide a specification for such wafers that sets forth allowable limits on various parameters, e.g., resistivity, flatness, doping levels, epi layer thickness, etc. As indicated in FIG. 3, wafers 11 are normally supplied with an identification mark 40, sometimes referred to as a wafer scribe. The wafer identification mark 40 is usually a number etched into the wafer. The wafer identification mark 40 may provide information as to one or more desired items of information, e.g., manufacturer, date of manufacture, location where the wafers were manufactured, the ingot from which the wafers were cut, the particular location of the wafer within the ingot, etc. That is, the wafer identification mark 40 may be such that all wafers 11 within a given ingot are assumed to be the same, or it may be such that wafers 11 within a given ingot may be distinguished from one another.

Figure 4:
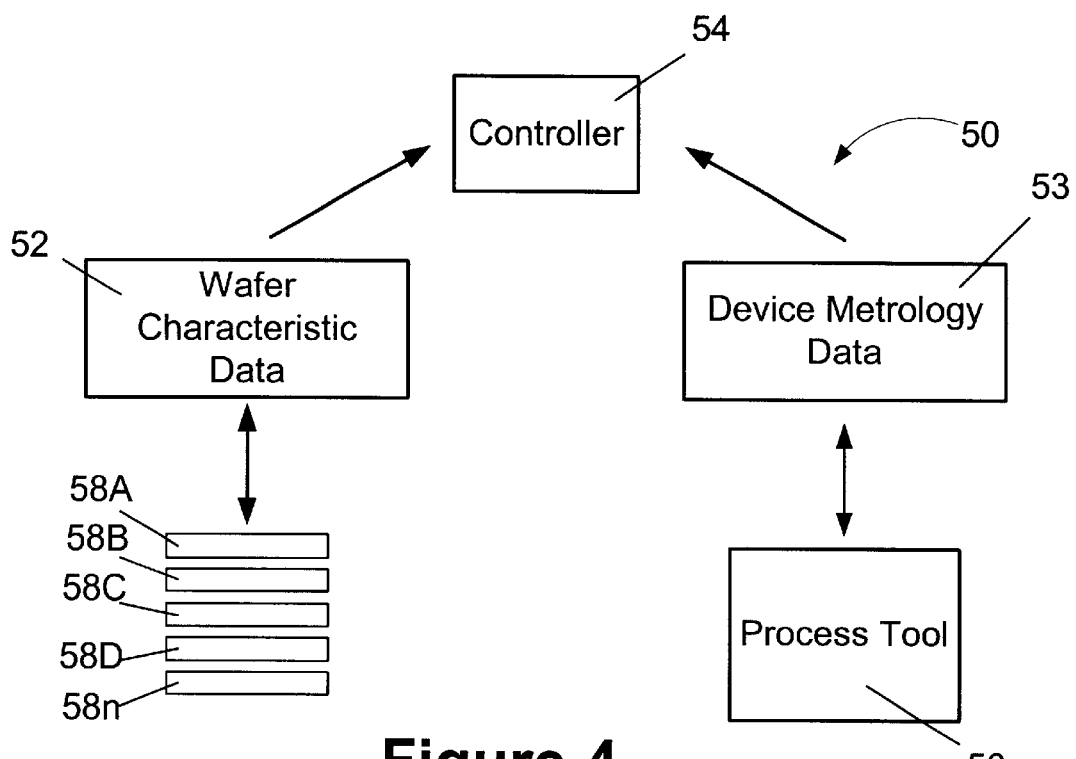
FIGS. 4 and 5 depict illustrative embodiments of a system that may be employed with various embodiments of the present invention.

FIG. 4 is an illustrative block diagram of a system that may be employed with one aspect of-the present invention. Depicted therein are a controller 54, an illustrative process tool 56, a plurality of wafers 58A-n (where "n" may go to infinity) and a block that is representative of wafer characteristic data 52 for the wafers 58A-n. A variety of wafer characteristic data 52 may be collected for the wafers 58A-n. For example, data may be obtained for wafer characteristics such as resistivity, doping concentrations, impurity levels, e.g., oxygen and carbon levels in silicon, flatness, crystal uniformity, point defects, dislocation defects, crystal growth defects, epi layer thickness, etc. The wafer characteristic data 52 may be, in whole or in part, provided by the wafer vendor at delivery and/or determined by the semiconductor device manufacturer through various tests after receipt of the wafers 58A-n from the wafer vendor. The methods of testing wafers for such characteristics are well known to those skilled in the art and will not be repeated herein in any detail.

The wafer characteristic data 52 may be associated with a unique wafer 11 through use of the wafer identification mark 40. The wafer identification mark 40 and its associated wafer characteristics may be provided to or accessed by the controller 54 in a variety of ways. For example, the wafer supplier may provide documentation regarding the wafer identification mark 40 and its associated wafer characteristics to the semiconductor device manufacturer in an electronic format that can be readily loaded into the controller 54 or another database (not shown). Alternatively, the semiconductor device manufacturer may use any of a variety of known optical character recognition systems to read the wafer identification mark 40 into the controller 54. At that time, the wafer characteristic data for each wafer may be input into (or accessed by) the controller 54. As yet another alternative, the semiconductor device manufacturer may specify to the wafer vendor that the wafer identification mark 40 take a different form than currently used such that the wafer identification mark 40 may be readily scanned into the controller 54. For example, such a wafer identification mark may take the form of a bar code that may be scanned into the controller 54. In the latter situation, the semiconductor manufacturer may also dictate that the new form of wafer identification mark 40 contain the desired wafer characteristic data for the wafer in a machine readable form. In this embodiment, the wafer identification mark 40 and the wafer characteristic data of interest may be scanned into the controller 54. In short, the wafer identification mark may be any type of machine readable alphanumeric character stream that provides information about the wafers.

The ultimate objective of the semiconductor fabrication process is to form, in and on the wafer surface, integrated circuit (IC) components (transistors, diodes, capacitors, resistors, etc.) that are wired together to form a functional electrical circuit. In many cases, the various IC components must meet individual physical and/or electrical performance specifications if the entire circuit is to function properly. Thus, throughout the manufacturing process, various metrology tests are performed to judge the effectiveness and accuracy of the previous process or processes, and in some instances, to test or predict the electrical performance characteristics of the resulting devices. In general, such metrology tests and resulting data will be referred to as device metrology data, as it is data obtained at some point during the process of fabricating the integrated circuit device.

As indicated in FIG. 4, in some embodiments of the present invention, the device metrology data, as indicated by block 53, is provided to or accessible by the controller 54. The device metrology data 53 in the present invention may be any type of metrology data that may be obtained in modern semiconductor manufacturing operations. Such metrology data may be directed to a variety of physical characteristics and/or electrical performance characteristics of the devices being manufactured. For example, such metrology data may include critical dimension measurements, resistance measurements, capacitance measurements, thickness measurements, drive current measurements, dopant concentrations and profiles, surface profiles, surface irregularities, leakage currents, etc. Moreover, such device metrology data may be obtained by performing a variety of known testing techniques, using a variety of known metrology tools. For example, the device metrology data may be obtained through use of metrology tools such as a scanning electron microscope, a transmission electron microscope, an ellipsometer, a reflectometer, a scatterometer, a four-point probe, etc. Thus, the present invention should not be considered as limited to any particular type of device metrology data, or the method in which such data is obtained, unless such limitations are clearly set forth in the appended claims.

When the device metrology data 53 is obtained, it may be associated with the appropriate wafer identification mark 40 at the time the data is collected, or it may be later associated with the wafer identification mark 40 by the controller 54. This may be readily accomplished by the personnel performing the metrology test—by scanning or manually recording the wafer identification number 40. Ultimately, the device metrology data 53 for each unique wafer identification number 40 will be provided to or accessible by the controller 54. To the extent the metrology tool (not shown) used for performing the various device metrology tests has its own controller (not shown), the device metrology data 53 may be readily supplied to the controller 54 by the metrology tool controller.

Once the controller 54 is provided with or accesses the wafer characteristic data 52 and the device metrology data 53, it may be used by the controller 54 for a variety of purposes. For example, in one embodiment, the controller 54 may use the wafer characteristic data 52 and the device metrology data 53 to identify certain wafers or groups of wafers that are associated with manufactured devices exhibiting very good or very bad electrical performance characteristics as evidenced by the device metrology data 53 obtained for such wafers. That is, through use of the present invention, it may be determined what wafer characteristics enhance or hamper the production of integrated circuit devices of a desired quality. For example, analysis of the wafer characteristic data 52 and the device metrology data 53 may result in the conclusion that the device's manufacturers specification needs to be tightened or revised in one or more areas. If the analysis of the wafer characteristic data 52 and the device metrology date 53 indicates that wafers having a resistance characteristic on the lower end of an allowable range statistically tend to result in integrated circuit devices, e.g., transistors, that operate at very high performance levels, e.g., switching speed, then the allowable resistance levels for wafers to be purchased in the future may be revised to reflect this new requirement. This methodology may be performed with respect to any wafer characteristic and any device metrology data.

In another embodiment, the present invention may be employed the evaluate the quality of the various wafer vendors that supply wafers to a semiconductor device manufacturer. For example, based upon the device metrology data 53, it may be determined that wafers produced by a certain wafer vendor statistically tend to produce devices that operate at very high or very low performance levels relative to devices formed on wafers from other wafer vendors. This may be the case even though all of the wafers supplied to the device manufacturer meet the same initial product specification. That is, through use of the present invention, problems with a particular wafer vendor's wafers may be identified based upon the ultimate requirement, i.e., device metrology data. In some situations, this may lead to the decision to stop using the particular vendor or investigate the cause of such problems and take corrective actions.

Figure 5:
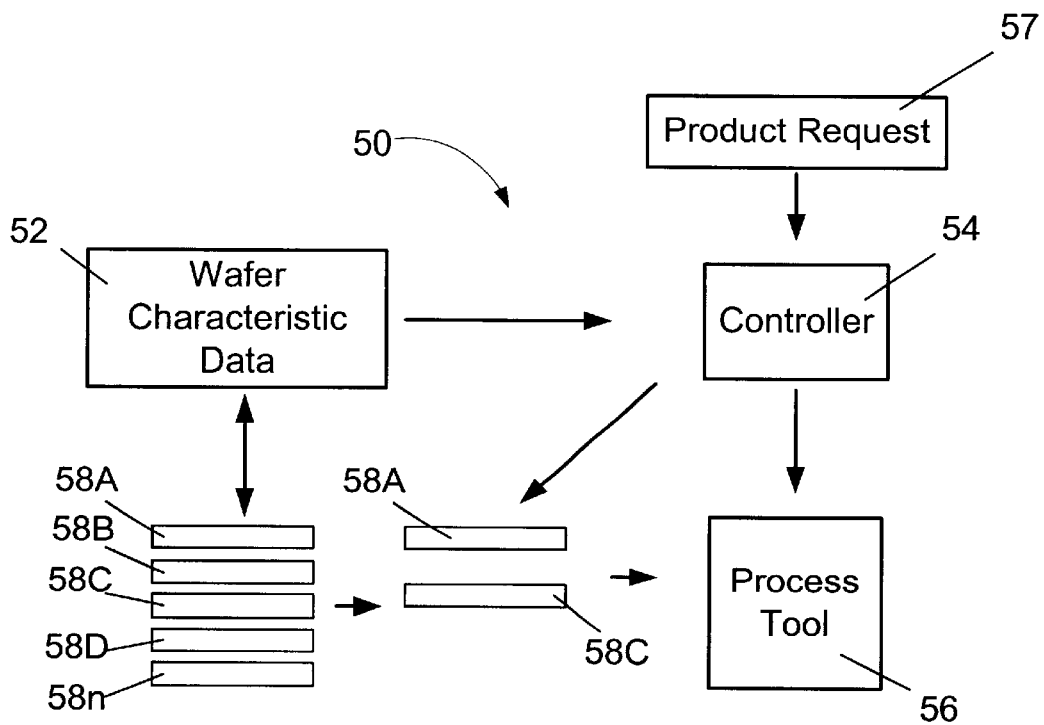

In another embodiment, depicted in FIG. 5, the controller 54 may be used to determine, based upon the wafer characteristic data 52, the best set of wafers to be used in forming a particular integrated circuit device. Such an application may have great value to companies, i.e., foundries, that manufacture a variety of different types of integrated circuit devices for a variety of different customers. For example, as indicated in FIG. 5, the foundry may receive a product request 57, e.g., a request to produce high performance microprocessors having a very high switching speed. Based upon such a request, the controller 54 may be used to identify selected wafers from a group of wafers 58A-n that possess wafer characteristics that are associated with the production of such devices, e.g., wafers having low resistance values, low levels of impurities, a low quantity of crystal defects, etc. In short, the foundry may use the present invention in an effort to maximize its potential yield of useful product by selecting the appropriate wafers to be used in forming the integrated circuit devices. By way of example, in the depicted illustration in FIG. 5, the wafers 58A and 58C have been identified from the group of wafers 58A-n as being the best choice of starting materials for fabrication of the devices requested in the product request 57.

The foundry, or other semiconductor manufacturer, may also use the present invention in manufacturing devices that are less sensitive in terms of certain performance characteristics. For example, if the product request 57 is for a product that is less demanding in terms of performance, e.g., lower performance microprocessors, integrated circuit products used in consumer goods, etc., then the present invention may be used to identify wafers that may be used to produce such product. That is, the present invention may be used to identify, based upon the wafer characteristic data, wafers that may have characteristics that are suitable for the production of relatively low-speed devices, but not high performance microprocessors. In short, the present invention may be employed to avoid the unnecessary consumption of high-quality wafers when the product being manufactured on the wafer does not warrant the use of such high-quality wafers.

In another embodiment, the present invention may be used to adapt or modify processing based upon the characteristics of the wafer. For example, the implant dose or energy of an ion implant process may be varied based upon the resistivity or doping level characteristics of the wafer. In this embodiment, an ion implant tool would be provided with or obtain the wafer identification mark 40 and resistivity and/or doping levels of the wafer to be processed. Based upon this resistivity and/or doping level information, one or more parameters of the ion implant process, e.g., implant dose, implant energy, may be varied or adjusted. Such adjustments may be made to a standard ion implant process to be performed in the ion implant tool, or it may involve downloading an entirely new recipe to the ion implant tool. In the case where multiple wafers are processed, the characteristics for the wafers being processed may be averaged or otherwise statistically manipulated.

The present invention may also be used to determine control limits, tool sets, etc. based upon the wafer characteristics. For example, it may be determined that a given number of wafers from a given ingot have a resistance value that is on the upper end of an allowable range specified by the device manufacturer. Based upon this information, subsequent ion implant processes performed on the wafers may be set to introduce dopant atoms at the higher end of an allowable implant dose to reduce the resistivity of the resulting device to desirable lower levels.

In the illustrated embodiment, the controller 54 is a computer programmed with software to implement the functions described herein. Moreover, the functions described for the controller 54 may be performed by one or more controllers spread through the system. For example, the controller 54 may be a fab level controller that is used to control processing operations throughout all or a portion of a semiconductor manufacturing facility. Alternatively, the controller 54 may be a lower level computer that controls only portions or cells of the manufacturing facility such as within an individual processing tool or set of tools that are required in a processing area of a manufacturing plant. Moreover, the controller 54 may be a stand-alone device, or it may reside on the process tool 56. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is generally directed to various methods for determining, tracking and/or controlling processing operations based upon wafer characteristics. In one illustrative embodiment, the method comprises providing a group of wafers, each wafer having a plurality of wafer characteristics, determining a semiconductor device type to be manufactured, selecting a plurality of wafers from the group of wafers based upon the semiconductor device type to be manufactured and at least one wafer characteristic of the plurality of wafer characteristics and manufacturing a plurality of the determined semiconductor devices on the selected plurality of wafers. In another embodiment, the method comprises providing the wafer characteristics and the identified semiconductor device type to a controller that selects a plurality of wafers from the group of wafers based upon one or more of the wafer characteristics and the type of semiconductor device to be manufactured.

In another illustrative embodiment, the method comprises providing a group of wafers, each wafer having an identification mark, performing a plurality of process operations on each of the wafers to form a plurality of integrated circuit devices thereabove and performing at least one metrology test at some point after at least one of the process operations have been performed to produce device metrology data. The method further comprises identifying wafers wherein the device metrology data lies outside of a preselected acceptable range, and identifying, based upon the wafer identification mark, a source of the wafers wherein the device metrology data lies outside of the preselected acceptable range. In some cases, the wafer identification mark and device metrology data may be provided to a controller and the controller may identify the source of wafers when the device metrology data lies outside of the preselected acceptable range.

In yet another illustrative embodiment, the method comprises providing a plurality of wafers, the wafers having an identification mark and a plurality of wafer characteristics, and storing the wafer identification marks and the wafer characteristics associated with the marks in a database. The method further comprises providing at least one of the wafers to a processing tool, accessing the database to determine at least one of the wafer characteristics of the wafer provided to the processing tool and determining at least one parameter of a process operation to be performed on the wafer in the processing tool based upon the determined wafer characteristics of the wafer provided to the processing tool.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a group of wafers, each wafer having a plurality of wafer characteristics; determining a semiconductor device type to be manufactured;
   selecting a plurality of wafers from said group of wafers based upon the semiconductor device type to be manufactured and at least one wafer characteristic of said plurality of wafer characteristics; and
   manufacturing a plurality of said determined semiconductor devices on said selected plurality of said wafers.

2. The method of claim 1, wherein providing a group of wafers, each wafer having a plurality of wafer characteristics, comprises providing a group of wafers, each wafer having a plurality of wafer characteristics comprised of at least one of a doping level, a resistivity, a surface flatness, an epi layer thickness, a crystalline structure, crystalline uniformity and impurity level.

3. The method of claim 1, wherein determining a semiconductor device type to be manufactured comprises determining a semiconductor device type to be manufactured, said semiconductor device type comprised of at least one of a logic device, a memory device, an application specific integrated circuit device, a transistor, an NMOS device, a PMOS device and a CMOS device.

4. The method of claim 1, wherein providing a group of wafers, each wafer having a plurality of wafer characteristics, comprises providing a group of wafers comprised of at least one of silicon and gallium arsenide, each wafer having a plurality of wafer characteristics.

5. A method, comprising:
   providing a group of wafers, each wafer having a plurality of wafer characteristics;
   identifying a semiconductor device type to be manufactured;
   providing said plurality of wafer characteristics and identified semiconductor device type to a controller that selects a plurality of wafers from said group of wafers based upon the semiconductor device type to be manufactured and at least one wafer characteristic of said plurality of wafer characteristics; and
   manufacturing a plurality of said identified semiconductor devices on said selected plurality of said wafers.

6. The method of claim 5, wherein providing a group of wafers, each wafer having a plurality of wafer characteristics, comprises providing a group of wafers, each wafer having a plurality of wafer characteristics comprised of at least one of a doping level, a resistivity, a surface flatness, an epi layer thickness, a crystalline structure, crystalline uniformity and impurity level.

7. The method of claim 5, wherein identifying a semiconductor device type to be manufactured comprises identifying a semiconductor device type to be manufactured, said semiconductor device type comprised of at least one of a logic device, a memory device, an application specific integrated circuit device, a transistor, an NMOS device, a PMOS device and a CMOS device.

8. The method of claim 5, wherein providing a group of wafers, each wafer having a plurality of wafer characteristics, comprises providing a group of wafers comprised of at least one of silicon and gallium arsenide, each wafer having a plurality of wafer characteristics.

9. A method, comprising:
providing a group of wafers, each wafer having an identification mark;
performing a plurality of process operations on each of said wafers to form a plurality of integrated circuit devices thereabove;
performing at least one metrology test at some point after at least one of said process operations have been performed to produce device metrology data;
identifying wafers wherein said device metrology data lies outside of a preselected acceptable range; and
identifying, based upon said wafer identification mark and said device metrology data, a source of said wafers wherein said device metrology data lies outside of said preselected acceptable range.

10. The method of claim 9, wherein providing a group of wafers, each wafer having an identification mark, comprises providing a group of wafers comprised of at least one of silicon and gallium arsenide, each wafer having an identification mark.

11. The method of claim 9, wherein performing a plurality of process operations on each of said wafers to form integrated circuit devices thereabove comprises performing a plurality of process operations on each of said wafers to form integrated circuit devices thereabove, said process operations comprised of at least one of a deposition process, an etching process, an ion implantation process, a chemical mechanical polishing process and a heating process.

12. The method of claim 9, wherein performing at least one metrology test at some point after at least one of said process operations have been performed to produce device metrology data comprises performing at least one metrology test at some point after at least one of said process operations have been performed to produce device metrology data, said metrology test comprised of at least one of an electrical test, a critical dimension measurement test, a surface flatness test, a resistivity test, a thickness test, a dopant concentration level test, a substrate impurities test and a crystalline structure test.

13. The method of claim 9, wherein said preselected acceptable range is determined based upon a type of integrated circuit device to be formed on said wafers.

14. The method of claim 9, wherein said preselected acceptable range is determined based upon a desired performance level of said integrated circuit devices.

15. The method of claim 9, wherein providing a group of wafers, each wafer having an identification mark, said identification mark comprised of a machine readable alphanumeric character stream.

16. The method of claim 9, further comprising adjusting at least one parameter of a wafer specification provided to said identified source based upon said identification of said wafers wherein said device metrology data lies outside of said preselected acceptable range.

17. A method, comprising:
providing a group of wafers, each wafer having an identification mark;
performing a plurality of process operations on each of said wafers to form a plurality of integrated circuit devices thereabove;
performing at least one metrology test at some point after at least one of said process operations have been performed to produce device metrology data; and
providing said device metrology data and said wafer identification mark to a controller, said controller performing the steps of:
identifying wafers wherein said device metrology data lies outside of a preselected acceptable range; and
identifying, based upon said wafer identification mark and said device metrology data, a source of said wafers wherein said device metrology data lies outside of said preselected acceptable range.

18. The method of claim 17, wherein providing a group of wafers, each wafer having an identification mark, comprises providing a group of wafers comprised of at least one of silicon and gallium arsenide, each wafer having an identification mark.

19. The method of claim 17, wherein performing a plurality of process operations on each of said wafers to form integrated circuit devices thereabove comprises performing a plurality of process operations on each of said wafers to form integrated circuit devices thereabove, said process operations comprised of at least one of a deposition process, an etching process, an ion implantation process, a chemical mechanical polishing process and a heating process.

20. The method of claim 17, wherein performing at least one metrology test at some point after at least one of said process operations have been performed to produce device metrology data comprises performing at least one metrology test at some point after at least one of said process operations have been performed to produce device metrology data, said metrology test comprised of at least one of an electrical test, a critical dimension measurement test, a surface flatness test, a resistivity test, a thickness test, a dopant concentration level test, a substrate impurities test and a crystalline structure test.

21. The method of claim 17, wherein said preselected acceptable range is determined based upon a type of integrated circuit device to be formed on said wafers.

22. The method of claim 17, wherein said preselected acceptable range is determined based upon a desired performance level of said integrated circuit devices.

23. The method of claim 17, wherein providing a group of wafers, each wafer having an identification mark, said identification mark comprised of a machine readable alphanumeric character stream.

24. The method of claim 17, further comprising adjusting at least one parameter of a wafer specification provided to said identified source based upon said identification of said wafers wherein said device metrology data lies outside of said preselected acceptable range.

25. A method, comprising:
providing a plurality of wafers, said wafers having an identification mark and a plurality of wafer characteristics;
storing said wafer identification marks and wafer characteristics associated with said wafer identification marks in a database;
providing at least one of said wafers to a processing tool;
accessing said database to determine at least one of said wafer characteristics of said at least one wafer provided to said processing tool; and
determining at least one parameter of a process operation to be performed on said at least one wafer in said processing tool based upon said determined at least one wafer characteristic of said at least one wafer provided to said processing tool.

26. The method of claim 25, wherein providing a plurality of wafers, said wafers having an identification mark and a plurality of wafer characteristics, comprises providing a plurality of wafers comprised of at least one of silicon and gallium arsenide, said wafers having an identification mark and a plurality of wafer characteristics.

27. The method of claim 25, wherein providing a plurality of wafers, said wafers having an identification mark and a plurality of wafer characteristics, comprises providing a plurality of wafers, said wafers having an identification mark and a plurality of wafer characteristics comprised of at least one of a doping level, a resistivity, a surface flatness, an epi layer thickness, a crystalline structure, crystalline uniformity and impurity levels.

28. The method of claim 25, wherein providing at least one of said wafers to a processing tool comprises providing a plurality of said wafers to a processing tool.

29. The method of claim 25, wherein providing at least one of said wafers to a processing tool comprises providing a lot of said wafers to a processing tool.

30. The method of claim 25, wherein providing at least one of said wafers to a processing tool comprises providing at least one of said wafers to a processing tool comprised of at least one of a deposition tool, an etching tool, an ion implantation tool, a chemical mechanical polishing tool and a heating tool.

31. The method of claim 25, wherein accessing said database to determine at least one of said wafer characteristics of said at least one wafer provided to said processing tool comprises accessing said database to determine a plurality of said wafer characteristics of said at least one wafer provided to said processing tool.

32. The method of claim 25, wherein determining at least one parameter of a process operation to be performed on said at least one wafer in said processing tool based upon said determined at least one wafer characteristic of said at least one wafer provided to said processing tool comprises determining an entire process recipe of a process operation to be performed on said at least one wafer in said processing tool based upon said determined at least one wafer characteristic of said at least one wafer provided to said processing tool.

33. The method of claim 25, wherein determining at least one parameter of a process operation to be performed on said at least one wafer in said processing tool based upon said determined at least one wafer characteristic of said at least one wafer provided to said processing tool comprises determining a modification of at least one parameter of a preselected process recipe of a process operation to be performed on said at least one wafer in said processing tool based upon said determined at least one wafer characteristic of said at least one wafer provided to said processing tool.

34. A method, comprising:
 providing a plurality of wafers, said wafers having an identification mark and a plurality of wafer characteristics;
 storing said wafer identification marks and wafer characteristics associated with said wafer identification marks in a database;
 providing at least one of said wafers to a processing tool; and
 providing a controller that performs the steps of:

accessing said database to determine at least one of said wafer characteristics of said at least one wafer provided to said processing tool; and
 determining at least one parameter of a process operation to be performed on said at least one wafer in said processing tool based upon said determined at least one wafer characteristic of said at least one wafer provided to said processing tool.

35. The method of claim 34, wherein providing a plurality of wafers, said wafers having an identification mark and a plurality of wafer characteristics, comprises providing a plurality of wafers comprised of at least one of silicon and gallium arsenide, said wafers having an identification mark and a plurality of wafer characteristics.

36. The method of claim 34, wherein providing a plurality of wafers, said wafers having an identification mark and a plurality of wafer characteristics, comprises providing a plurality of wafers, said wafers having an identification mark and a plurality of wafer characteristics comprised of at least one of a doping level, a resistivity, a surface flatness, an epi layer thickness, a crystalline structure, crystalline uniformity and impurity levels.

37. The method of claim 34, wherein providing at least one of said wafers to a processing tool comprises providing a plurality of said wafers to a processing tool.

38. The method of claim 34, wherein providing at least one of said wafers to a processing tool comprises providing a lot of said wafers to a processing tool.

39. The method of claim 34, wherein providing at least one of said wafers to a processing tool comprises providing at least one of said wafers to a processing tool comprised of at least one of a deposition tool, an etching tool, an ion implantation tool, a chemical mechanical polishing tool and a heating tool.

40. The method of claim 34, wherein accessing said database to determine at least one of said wafer characteristics of said at least one wafer provided to said processing tool comprises accessing said database to determine a plurality of said wafer characteristics of said at least one wafer provided to said processing tool.

41. The method of claim 34, wherein determining at least one parameter of a process operation to be performed on said at least one wafer in said processing tool based upon said determined at least one wafer characteristic of said at least one wafer provided to said processing tool comprises determining an entire process recipe of a process operation to be performed on said at least one wafer in said processing tool based upon said determined at least one wafer characteristic of said at least one wafer provided to said processing tool.

42. The method of claim 34, wherein determining at least one parameter of a process operation to be performed on said at least one wafer in said processing tool based upon said determined at least one wafer characteristic of said at least one wafer provided to said processing tool comprises determining a modification of at least one parameter of a preselected process recipe of a process operation to be performed on said at least one wafer in said processing tool based upon said determined at least one wafer characteristic of said at least one wafer provided to said processing tool.

* * * * *